(12) United States Patent
Schwarzenbach et al.

(10) Patent No.: US 12,148,755 B2
(45) Date of Patent: Nov. 19, 2024

(54) FRONT-SIDE-TYPE IMAGE SENSOR

(71) Applicant: Soitec, Bernin (FR)

(72) Inventors: Walter Schwarzenbach, Saint Nazaire les Eymes (FR); Manuel Sellier, Grenoble (FR); Ludovic Ecarnot, Grenoble (FR)

(73) Assignee: Soitec, Bernin (FR)

( * ) Notice: Subject to any disclaimer, the term of this patent is extended or adjusted under 35 U.S.C. 154(b) by 918 days.

(21) Appl. No.: 17/254,808

(22) PCT Filed: Jun. 21, 2019

(86) PCT No.: PCT/FR2019/051515
§ 371 (c)(1),
(2) Date: Aug. 18, 2021

(87) PCT Pub. No.: WO2019/243751
PCT Pub. Date: Dec. 26, 2019

(65) Prior Publication Data
US 2021/0384223 A1 Dec. 9, 2021

(30) Foreign Application Priority Data
Jun. 21, 2018 (FR) ...................................... 1855540

(51) Int. Cl.
*H01L 27/12* (2006.01)
*H01L 27/146* (2006.01)

(52) U.S. Cl.
CPC ...... *H01L 27/1203* (2013.01); *H01L 27/1461* (2013.01); *H01L 27/1462* (2013.01);
(Continued)

(58) Field of Classification Search
CPC ............ H01L 27/1203; H01L 27/1461; H01L 27/1462; H01L 27/1463; H01L 27/14643;
(Continued)

(56) References Cited

U.S. PATENT DOCUMENTS 2,364,958 A 12/1940 Drennan
6,365,479 B1 * 4/2002 U'Ren .............. H01L 29/66242
438/320
(Continued)

FOREIGN PATENT DOCUMENTS

CN 105575982 A 5/2016
EP 0183203 B1 12/2020
(Continued)

OTHER PUBLICATIONS

L. Carletti et al., "Nonlinear optical properties of SiGe waveguides in the mid-infrared," 2014 Conference on Lasers and Electro-Optics (CLEO)—Laser Science to Photonic Applications, San Jose, CA, USA, 2014, pp. 1-2, doi: 10.1364/CLEO_SI.2014.SW3M.7.*
(Continued)

*Primary Examiner* — Moin M Rahman
*Assistant Examiner* — Eric Manuel Mulero Flores
(74) *Attorney, Agent, or Firm* — TraskBritt

(57) ABSTRACT

The invention relates to a front-side imager comprising in succession: —a semiconductor carrier substrate, a first electrically insulating separating layer, and a single-crystal semiconductor layer, called the active layer, comprising a matrix array of photodiodes, wherein the imager further comprises between the carrier substrate and the first electrically insulating layer: —a second electrically insulating separating layer, and —a second semiconductor or electrically conductive layer, called the intermediate layer, arranged between the second separating layer and the first separating layer, the second separating layer being thicker than the first separating layer.

17 Claims, 6 Drawing Sheets

(52) U.S. Cl.
CPC .... *H01L 27/1463* (2013.01); *H01L 27/14643* (2013.01); *H01L 27/14683* (2013.01)

(58) Field of Classification Search
CPC ......... H01L 27/14683; H01L 27/14649; H01L 27/14692; H01L 27/146–14893; H01L 2924/12043; H01L 31/1013; H01L 31/0232–02327; H01L 31/028; H01L 31/0312; H01L 31/1804–1824; H01L 31/054; H01L 31/0547
See application file for complete search history.

(56) References Cited

U.S. PATENT DOCUMENTS

| | | | |
|---|---|---|---|
| 9,859,311 B1* | 1/2018 | Manabe | H01L 27/1464 |
| 2005/0205930 A1* | 9/2005 | Williams, Jr. | H01L 27/1463 |
| | | | 257/E21.703 |
| 2006/0255371 A1 | 11/2006 | Roy et al. | |
| 2007/0085117 A1* | 4/2007 | Wilson | H01L 27/14683 |
| | | | 257/291 |
| 2008/0290525 A1 | 11/2008 | Anderson et al. | |
| 2009/0294883 A1* | 12/2009 | Swain | H01L 27/1464 |
| | | | 438/458 |
| 2011/0316107 A1* | 12/2011 | Tsukamoto | H01L 27/146 |
| | | | 257/E31.127 |
| 2013/0214356 A1 | 8/2013 | Cheng et al. | |
| 2013/0228886 A1* | 9/2013 | JangJian | H01L 27/1464 |
| | | | 257/E31.127 |
| 2014/0339614 A1* | 11/2014 | Fang | H01L 27/14603 |
| | | | 257/292 |
| 2015/0293302 A1* | 10/2015 | Czornomaz | H01S 5/026 |
| | | | 438/31 |
| 2016/0020138 A1* | 1/2016 | Chang | H01L 21/76224 |
| | | | 257/508 |
| 2016/0118431 A1* | 4/2016 | Dutartre | H01L 21/76264 |
| | | | 438/70 |
| 2016/0218128 A1 | 7/2016 | Shieh et al. | |
| 2016/0276381 A1 | 9/2016 | Park | |
| 2017/0025454 A1* | 1/2017 | Cheng | H01L 31/02327 |
| 2019/0067343 A1* | 2/2019 | Chen | H01L 27/1461 |

FOREIGN PATENT DOCUMENTS

| | | |
|---|---|---|
| JP | 3444880 B2 | 9/2003 |
| JP | 2007-096274 A | 4/2007 |
| JP | 2011-522415 A | 7/2011 |
| JP | 2013-115100 A | 6/2013 |
| JP | 2016-063224 A | 4/2016 |
| JP | 2016-092178 A | 5/2016 |
| JP | 2017-054890 A | 3/2017 |
| KR | 10-2007-0118391 A | 12/2007 |
| KR | 10-0832152 B1 | 5/2008 |
| WO | 93/04993 A1 | 3/1993 |
| WO | 2010/018204 A1 | 2/2010 |
| WO | 2011/054852 A1 | 5/2011 |
| WO | 2016/206809 A1 | 12/2016 |
| WO | 2018/083990 A1 | 5/2018 |

OTHER PUBLICATIONS

International Search Report for International Application No. PCT/FR2019/051515, mailed Dec. 13, 2019, 3 pages.
International Written Opinion for International Application No. PCT/FR2019/051515, mailed Dec. 13, 2019, 20 pages with translation.
French Search Report for Application No. 1855540 dated Mar. 8, 2022, 4 pages.
Singapore Search Report and Written Opinion for Application No. 11202012792S dated Apr. 11, 2022, 9 pages.
Japanese Notice of Reasons for Rejections for Application No. 2020-569753 dated Jun. 13, 2013, 7 pages.
International Search Report for International Application No. PCT/GB2019/051847 dated Jun. 28, 2019, 6 pages.
International Written Opinion for International Application No. PCT/GB2019/051847 dated Jun. 28, 2019, 11pages.
Korean Office Action for Application No. 10-2020-7037625 dated Aug. 20, 2023, 15 pages.
Chinese Office Action for Application No. 201980041160.1 dated Apr. 1, 2024, 20 pages.

* cited by examiner

FRONT-SIDE-TYPE IMAGE SENSOR

CROSS-REFERENCE TO RELATED APPLICATIONS

This application is a national phase entry under 35 U.S.C. § 371 of International Patent Application PCT/FR2019/051515, filed Jun. 21, 2019, designating the United States of America and published as International Patent Publication WO 2019/243751 A1 on Dec. 26, 2019, which claims the benefit under Article 8 of the Patent Cooperation Treaty to French Patent Application Serial No. 1855540, filed Jun. 21, 2018.

TECHNICAL FIELD

This disclosure relates to a front-side imager, and to a process for manufacturing such an imager.

BACKGROUND

Document US 2016/0118431 describes a front-side imager.

As illustrated in FIG. 1, the imager comprises a semiconductor-on-insulator (SOI) substrate comprising, from its back side to its front side, a silicon carrier substrate 1' having a certain dopant level, a layer 2' of silicon oxide called the buried oxide (BOX), and a layer 3' called the active silicon layer having a dopant level that is able to be different from that of the silicon carrier substrate 1', in which layer a matrix array of photodiodes is defined, each photodiode defining one pixel.

According to one embodiment, the buried oxide is chosen to be relatively thin (i.e., to have a thickness smaller than 100 nm and, in particular, of about 20 nm) in order to play the role of the dielectric of a capacitor. That portion of the substrate that is located below the buried oxide is biased to a voltage different from the voltage of the active layer, thus allowing the interface between the dielectric layer and this active layer to be passivated.

The voltage to be applied to that portion of the substrate that is located under the BOX depends on the thickness of the latter. The potential difference to be applied is proportional to the thickness of the buried oxide.

Inversely, if the buried oxide is chosen to be relatively thick (i.e., to have a thickness of about 100 to 200 nm or more), it has reflective optical properties and allows incident photons to be reflected so as to confine them in the active layer, in particular, in the case of photons the wavelength of which is in the range of the near infrared.

The optimal thickness ranges for each of these two functions do not coincide, and the skilled person is required to make a compromise between the reflectivity of the buried oxide and his ability to polarize each pixel by applying a low potential difference between the active layer and the substrate.

BRIEF SUMMARY

One aim of the present disclosure is to design a front-side imager that performs better than existing imagers and, in particular, a substrate from which the imager may be obtained.

This substrate is able to be fabricated at a low cost.

To this end, a first subject of the present disclosure relates to a front-side imager comprising in succession:
a semiconductor carrier substrate,
a first electrically insulating separating layer, and
a single-crystal semiconductor layer, referred to as the "active layer," comprising a matrix array of photodiodes,
wherein, the imager further comprises, between the carrier substrate and the first electrically insulating layer:
a second electrically insulating separating layer, and
a second semiconductor or electrically conductive layer, referred to as the "intermediate layer," arranged between the second separating layer and the first separating layer, the second separating layer being thicker than the first separating layer.

The term "front side," as used herein, means that side of the imager that is intended to be exposed to light radiation, which side is located on the same side of the structure as the associated electronic components.

The first separating layer advantageously has a thickness between 10 and 100 nm.

The second separating layer advantageously has a thickness between 100 and 300 nm.

According to one embodiment, the intermediate layer is made of a doped polycrystalline or amorphous material.

According to one embodiment, the intermediate layer is made of doped silicon.

Alternatively, the intermediate layer is made of a metal.

The intermediate layer advantageously has a thickness between 20 and 150 nm.

According to one embodiment, the active layer comprises a silicon seed layer.

According to another embodiment, the active layer is a silicon-germanium layer.

According to one embodiment, the active layer further comprises a single-crystal layer of silicon-germanium on the seed layer.

Particularly advantageously, the germanium content in the silicon-germanium layer is lower than or equal to 10%.

Preferably, the thickness of the silicon-germanium layer is smaller than a critical thickness defined as being a thickness beyond which the silicon-germanium relaxes.

According to another embodiment, the active layer further comprises a single-crystal layer of silicon on the seed layer.

According to one embodiment, the substrate further comprises, on the active layer, a layer referred to herein as the optical confinement layer having a coefficient of optical reflection from the front side toward the active layer higher than the coefficient of reflection from the active layer toward the front side.

Advantageously, the optical confinement layer comprises a layer of titanium nitride between two layers of silicon oxide.

According to one embodiment, each photodiode is separated from an adjacent photodiode by at least one electrically isolating trench extending up to the first electrically insulating layer.

Advantageously, the trench comprises an electrically conductive or semiconductor via extending up to the intermediate layer between walls made of an electrically insulating material.

According to one embodiment, the at least one trench extends through the optical confinement layer.

According to one embodiment, each trench comprises a first wall extending up to the intermediate layer and a second wall extending at least partially into the second separating layer so as to electrically isolate a segment of the intermediate layer, the electrically conductive or semiconductor via being electrically connected to the segment of the intermediate layer.

The imager such as described above is formed from a substrate for a front-side imager, comprising in succession:
the semiconductor carrier substrate,
the first electrically insulating separating layer, and
a single-crystal semiconductor layer, called the seed layer, which is suitable for epitaxial growth of a single-crystal semiconductor layer,
the substrate further comprising, between the carrier substrate and the first electrically insulating layer:
the second electrically insulating separating layer, and
the second semiconductor or electrically conductive layer, called the intermediate layer, arranged between the second separating layer and the first separating layer, the second separating layer being thicker than the first separating layer.

According to one embodiment, the seed layer is a silicon layer.

According to another embodiment, the seed layer is a silicon-germanium layer.

According to one embodiment, the substrate further comprises a silicon-germanium single-crystal layer on the seed layer, the silicon-germanium layer forming, with the seed layer, the active layer of the imager.

According to another embodiment, the substrate further comprises a silicon single-crystal layer on the seed layer, the silicon layer forming, with the seed layer, the active layer of the imager.

According to one embodiment, the substrate may be fabricated using a process comprising the following steps:
providing a first donor substrate,
forming a weakened zone in the first donor substrate, so as to delineate a first semiconductor layer,
transferring the first layer to a semiconductor carrier substrate, an electrically insulating layer being at the interface between the donor substrate and the carrier substrate so as to form a structure comprising the carrier substrate, the electrically insulating layer, and the transferred layer,
providing a second donor substrate,
forming a weakened zone in the second donor substrate, so as to delineate a single-crystal semiconductor layer,
transferring the single-crystal semiconductor layer to the structure, an electrically insulating layer being at the interface between the second donor substrate and the structure.

According to one alternative embodiment, the substrate may be fabricated using a process comprising the following steps:
forming a structure by depositing an electrically conductive or semiconductor layer on a carrier substrate covered with an electrically insulating layer,
providing a donor substrate,
forming a weakened zone in the donor substrate, so as to delineate a single-crystal semiconductor layer,
transferring the single-crystal semiconductor layer to the structure, an electrically insulating layer being at the interface between the second donor substrate and the structure.

Another subject of the present disclosure relates to a process for fabricating a front-side imager such as described above.

According to one embodiment, the fabricating process comprises the following steps:
providing a first donor substrate,
forming a weakened zone in the first donor substrate, so as to delineate a first semiconductor layer,
transferring the first layer to a semiconductor carrier substrate, an electrically insulating layer being at the interface between the donor substrate and the carrier substrate so as to form a structure comprising the carrier substrate, the electrically insulating layer, and the transferred layer,
providing a second donor substrate,
forming a weakened zone in the second donor substrate, so as to delineate a single-crystal semiconductor layer,
transferring the single-crystal semiconductor layer to the structure, an electrically insulating layer being at the interface between the second donor substrate and the structure,
epitaxially growing a single-crystal semiconductor layer on the transferred single-crystal semiconductor layer, the epitaxial single-crystal semiconductor layer forming, with the transferred single-crystal semiconductor layer, an active layer of the imager.

According to one alternative embodiment, the fabricating process comprises the following steps:
forming a structure by depositing an electrically conductive or semiconductor layer on a carrier substrate covered with an electrically insulating layer,
providing a donor substrate,
forming a weakened zone in the donor substrate, so as to delineate a single-crystal semiconductor layer,
transferring the single-crystal semiconductor layer to the structure, an electrically insulating layer being at the interface between the second donor substrate and the structure,
epitaxially growing a single-crystal semiconductor layer on the transferred single-crystal semiconductor layer, the epitaxial single-crystal semiconductor layer forming, with the transferred single-crystal semiconductor layer, an active layer of the imager.

The processes further comprise a step of forming a matrix array of photodiodes in the active layer.

Moreover, a layer referred to herein as the optical confinement layer may be formed on the active layer, the optical confinement layer having a coefficient of optical reflection from the front side toward the active layer higher than the coefficient of reflection from the active layer toward the front side.

BRIEF DESCRIPTION OF THE DRAWINGS

Other features and advantages of the present disclosure are described in the detailed description that follows, with reference to the accompanying drawings in which.

To make the drawings more clear, the various layers have not necessarily been shown to scale.

DETAILED DESCRIPTION

Figure 1:
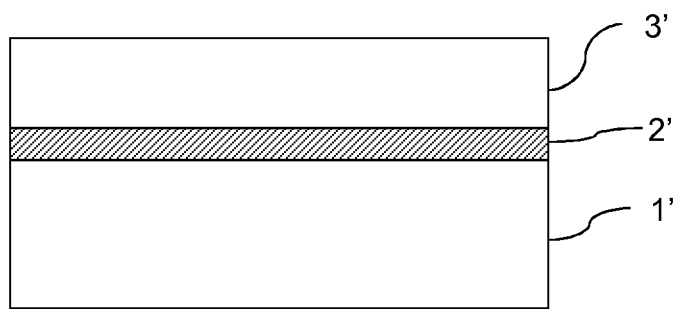
FIG. 1 is a cross-sectional view of an SOI substrate for a front-side imager such as described in document US 2016/0118431.

Contrary to the substrate of FIG. 1, an imager substrate according to this disclosure comprises a stack comprising two electrically insulating separating layers separated by a semiconductor or electrically conductive layer called the intermediate layer. The stack is interposed between the carrier substrate and the active layer, and it is configured to reflect photons that pass through the active layer toward the same active layer.

The carrier substrate is generally obtained by slicing a single-crystal ingot. The substrate essentially plays the role of mechanical carrier of the imager. The carrier substrate may comprise a material chosen from silicon, III-V semiconductors, glass, silica, sapphire, alumina, aluminum nitride, silicon carbide or even a ceramic or a metal alloy. Advantageously, the carrier substrate is made of silicon. Its doping (if it is a question of silicon), nature and characteristics may be optimized in order to integrate, in a hybrid way, in the form of a system-on-chip, electronic devices other than the imager. The doping of the substrate may be uniform throughout the thickness of the material or limited to one segment thereof. Preferably, the doped zone is adjacent to one of the two separating layers.

The active layer comprises a single-crystal semiconductor and is intended to receive a matrix array of photodiodes that allow images to be captured.

The two separating layers on either side of the intermediate layer have different thicknesses and play different roles in the operation of the imager.

The first separating layer is located on the side of the front side, and it is thinner than the second separating layer, which is located on the side of the back side.

The role of the first separating layer is to allow a bias to be transferred from the intermediate layer to the active layer. The role of the second separating layer is to electrically insulate the intermediate layer from the substrate, and to allow the stack of the layers separating the active layer from the carrier substrate to have a suitable reflectivity with respect to photons coming from the active layer.

Each of the two separating layers is made from an electrically insulating material, such as a dielectric material, for example, an oxide, such as a thermal or deposited silicon oxide, or even an oxynitride. The structure comprising these two electrically insulating separating layers may then be qualified a "double BOX," i.e., a "double buried oxide."

On the side of its front side, the substrate comprises a seed layer on the first separating layer, the seed layer being a single-crystal semiconductor layer suitable for the epitaxial growth of a single-crystal semiconductor layer intended to form, with the seed layer, the active layer of the imager.

The material of the seed layer is chosen depending on the material of the epitaxial layer and, in particular, has a lattice parameter suitable for allowing the growth of the epitaxial layer while preventing or at the very least minimizing the generation of crystal defects such as dislocations.

The seed layer and the epitaxial layer may be made of the same material (homoepitaxy) or two different materials (heteroepitaxy).

The epitaxial layer may be made of silicon. In this case, the seed layer is advantageously made of silicon.

Preferably, the epitaxial layer is made of silicon-germanium (SiGe) because silicon-germanium has an optical absorption coefficient higher than that of silicon, in particular, in the infrared, this absorption coefficient being proportional to the concentration of germanium. The seed layer may then be made of silicon-germanium or of silicon. In the latter case, the design of the epitaxial layer must not take into account only the concentration of germanium but also the thickness of the layer. Specifically, if the SiGe layer is formed by epitaxy on a silicon seed layer, the lattice parameter of which is different from that of the silicon-germanium, the SiGe layer relaxes beyond a certain thickness, called the critical thickness. This relaxation results in the formation of dislocations within the SiGe layer. Such dislocations make the SiGe layer unsuitable for use as active layer, in particular, in an imager and must, therefore, be avoided. Now, the critical thickness is inversely proportional to the concentration of germanium. The thickness of the epitaxial layer and the concentration of germanium in the layer, therefore, result from a compromise between:

on the one hand, a thickness sufficiently large to capture a maximum of photons at the wavelengths of the near infrared, on the other hand, a sufficient concentration of germanium to increase the ability to absorb photons with the active layer, in particular, in the near infrared, and lastly, a limited thickness (dependent on concentration), smaller than the critical thickness, in order to prevent the relaxation of the silicon-germanium and the creation of crystal defects (dislocations) that results therefrom.

Typically, it is sought to maximize the thickness and the concentration of germanium of the epitaxial layer in order to obtain the best possible absorption in the infrared. Preferably, the germanium content of the active layer is lower than or equal to 10%. Specifically, the critical thickness of a layer of $Si_{0.9}Ge_{0.1}$ is about a few microns, this being suitable for the active layer of a front-side imager.

The intermediate layer may be a semiconductor or even an electrically conductive material. Specifically, the role of this intermediate layer is to allow the active layer to be biased from behind, in other words, via a zone placed between the carrier substrate and the second electrically insulating layer. Such a bias allows a potential difference to be applied between the active layer and the buried intermediate layer.

The intermediate layer may be single-crystal but this is not indispensable because it is neither sought to achieve the ability to conduct electrons through this layer, nor any other electronic property such as commonly considered for applications other than that of imagers, but merely to achieve the ability to modify the electrical potential of the active layer on the periphery of the first separating layer.

The intermediate layer may thus be polycrystalline and/or amorphous, this making it less expensive to fabricate, and/or a metal. This layer may be doped to a greater or lesser extent so as to ensure it is able to be biased. A semiconductor intermediate layer is advantageously made of silicon. The layer then typically has a thickness between 20 nm and 150 nm.

The first electrically insulating separating layer, which is interposed between the active layer and the intermediate layer, plays the role of the dielectric of a capacitor, and thus allows the active layer to be biased on the periphery of the electrically insulating material. To this end, the first separating layer is chosen to be sufficiently thin to minimize the potential difference to be applied between the intermediate layer and the active layer. Typically, the thickness of the first separating layer is between 10 nm and 100 nm.

The thickness of the first separating layer is in contrast too small to allow all the photons that pass through the active layer and, in particular, photons the wavelength of which is in the range of the near infrared, to be reflected. Therefore, photons that pass through the active layer are liable to pass through the first separating layer and the intermediate layer.

The role of the second separating layer is to induce a reflection of the photons, in particular, photons the wavelength of which is in the range of the near infrared, toward the pixel formed in the active layer through the stack comprising: the second separating layer, the intermediate layer and the first separating layer. To this end, this second separating layer has a sufficiently large thickness to have a high reflectivity (or optical reflection coefficient), in particular, in the field of the near infrared. Typically, the thickness of the second separating layer, which is, for example, made of silicon oxide, is between 100 nm and 300 nm.

Figure 2:
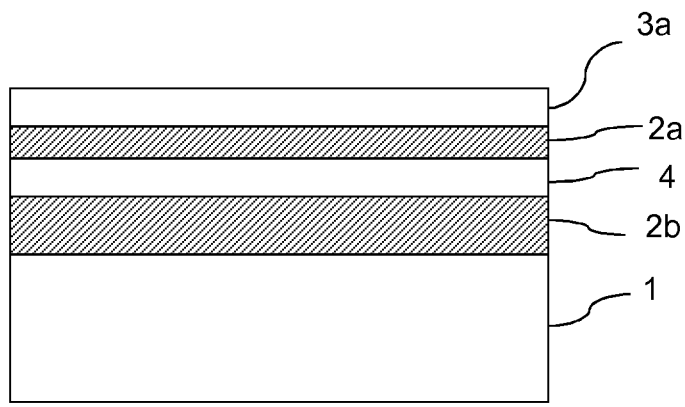
FIG. 2 is a cross-sectional view of an SOI substrate, ready for epitaxy to form the active layer of a front-side imager according to the present disclosure.

FIG. 2 is a cross-sectional view of a substrate for a front-side imager according to one embodiment of the disclosure.

The substrate comprises in succession, from its back side to its front side:
a carrier substrate 1, preferably a semiconductor carrier substrate,
the second electrically insulating separating layer 2b,
the semiconductor intermediate layer 4,
the first electrically insulating separating layer 2a, and
the single-crystal semiconductor seed layer 3a.

Examples of processes for fabricating the substrate illustrated in FIG. 2 will now be described.

According to a first embodiment, which is illustrated in FIGS. 3A-3E, the process for fabricating the substrate comprises two successive layer-transfer steps in which the SMART CUT® process is, for example, implemented two times.

Figure 3A:
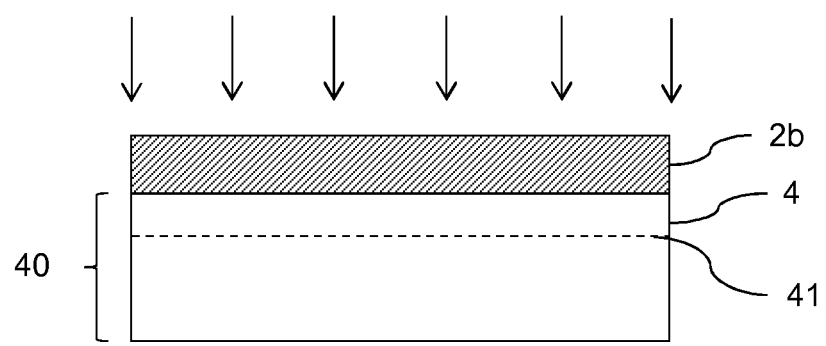
FIGS. 3A to 3E schematically illustrate the main steps of a process for fabricating the substrate of FIG. 2.

On the one hand, with reference to FIG. 3A, a first donor substrate 40 comprising a semiconductor intended to form the intermediate layer 4 is provided.

Figure 3B:
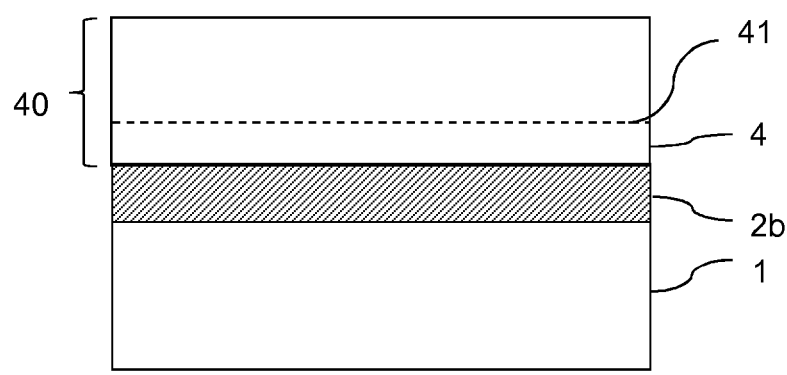
Figure 3C:
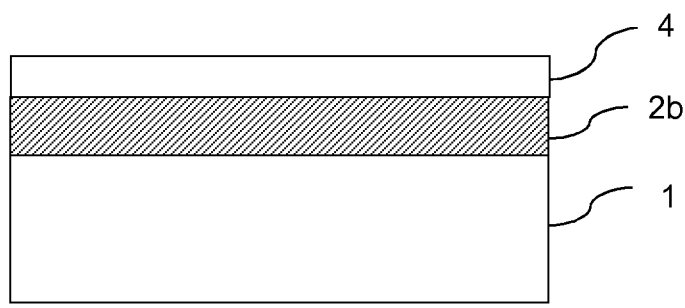

On the other hand, with reference to FIG. 3B, the carrier substrate 1 is provided, and the donor substrate is bonded to the carrier substrate, the second separating layer 2b being at the bonding interface. As shown in FIG. 3A, second separating layer 2b is, for example, formed beforehand on the surface of the first donor substrate 40 before the bonding. Alternatively, the second separating layer 2b could be formed on the carrier substrate 1, or even formed by joining a layer formed on the first donor substrate and a layer formed on the carrier substrate.

Next, the first donor substrate is thinned so as to transfer a layer 4 of the semiconductor to the receiver substrate. This thinning may be carried out by polishing or etching of the semiconductor from the side opposite to the bonding interface. However, advantageously, before the bonding step, a weakened zone 41 is advantageously formed in the semiconductor so as to delineate a surface layer 4 to be transferred; the weakened zone may be formed by implanting atomic species such as hydrogen and/or helium (implantation being schematically shown by arrows in FIG. 3A). After the bonding step, the thinning involves detaching the first donor substrate 40 along the weakened zone 41, this leading to the transfer of the intermediate layer 4 to the carrier substrate 1 (see FIG. 3C). Typically, the thickness of the transferred layer 4 is smaller than or equal to 300 nm. Optionally, a finishing treatment is carried out on the free surface of the transferred layer in order to promote the implementation of a new layer-transfer step, this treatment possibly leading to the transferred layer being thinned and its roughness decreased.

Figure 3D:
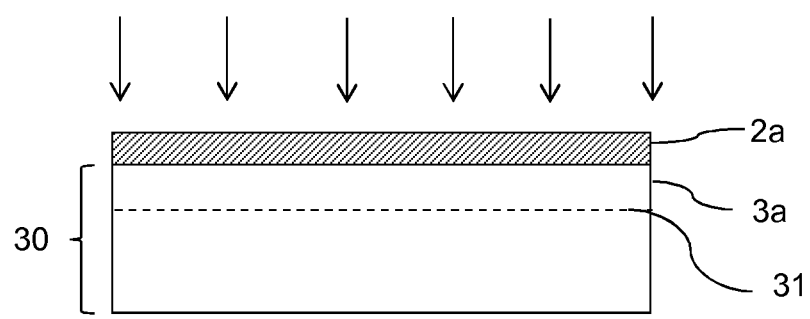

Moreover, with reference to FIG. 3D, a second donor substrate 30 comprising a single-crystal material suitable for the epitaxial growth of the active layer and intended to form the seed layer 3a is provided.

Figure 3E:
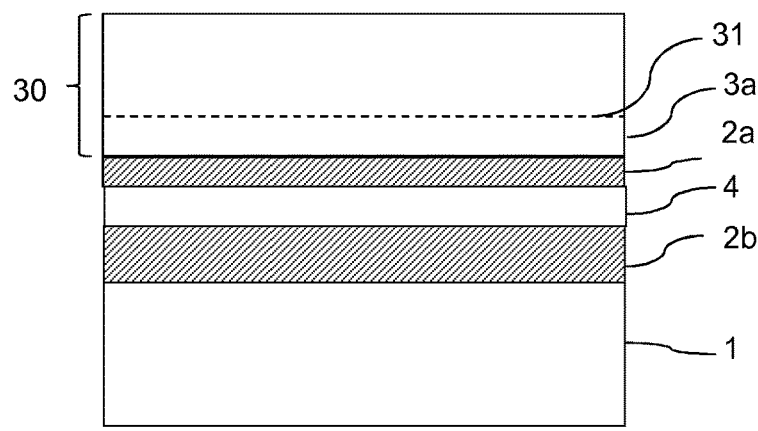

With reference to FIG. 3E, this second donor substrate is bonded to the intermediate layer 4 transferred beforehand to the carrier substrate 1, the first separating layer 2a being at the bonding interface. As shown in FIG. 3D, the layer 2a is, for example, formed beforehand on the surface of the second donor substrate 30 before the bonding. Alternatively, the layer 2a could be formed on the intermediate layer 4 after its transfer to the carrier substrate 1, or even formed by joining a layer formed on the second donor substrate and a layer formed on the transferred intermediate layer.

Next, the second donor substrate is thinned so as to transfer a layer 3a of the semiconductor to the receiver substrate, thus allowing the substrate shown in FIG. 2 to be obtained. This thinning may be carried out by polishing or etching the semiconductor so as to obtain the thickness and surface finish desired for the epitaxy of the active layer. However, advantageously, before the bonding step, a weakened zone 31 is advantageously formed in the single-crystal semiconductor so as to delineate the seed layer 3a to be transferred. After the bonding step, the thinning involves detaching the second donor substrate 30 along the weakened zone 31, this leading to the transfer of the seed layer 3a to the structure consisting of the carrier substrate 1, of the second separating layer 2b and of the intermediate layer 4. Typically, the thickness of the transferred seed layer is smaller than or equal to 300 nm. Optionally, a finishing treatment is carried out on the free surface of the transferred seed layer in order to promote the implementation of the epitaxy, this treatment possibly leading to the transferred layer being thinned and/or its roughness decreased.

According to a second embodiment, illustrated in FIGS. 4A-4D, the process for fabricating the substrate comprises a step of depositing the intermediate layer (instead of transferring the layer from a donor substrate) and a single layer-transfer step, to form the seed layer.

This second embodiment of the process takes advantage of the fact that the semiconductor intermediate layer does not have an optical or electronic function and may, therefore, be made from a material that is not single-crystal but polycrystalline and/or amorphous. Thus, the intermediate layer may be formed by deposition on the subjacent second electrically insulating layer 2b.

Figure 4A:
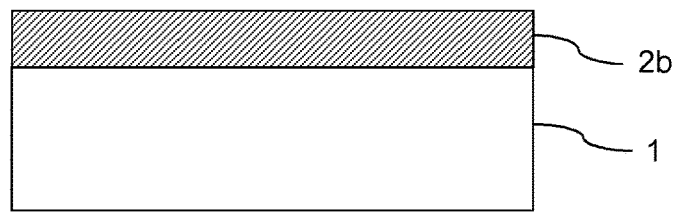
FIGS. 4A to 4D schematically illustrate the main steps of another process for fabricating the substrate of FIG. 2.

With reference to FIG. 4A, the carrier substrate 1 covered with the second separating layer 2b is provided. The layer 2b is typically formed by thermal oxidation of the carrier substrate 1 if the latter is made of silicon. The layer may also be formed by chemical vapor deposition (CVD), which may then possibly require a treatment aiming to decrease its roughness to be carried out.

Figure 4B:
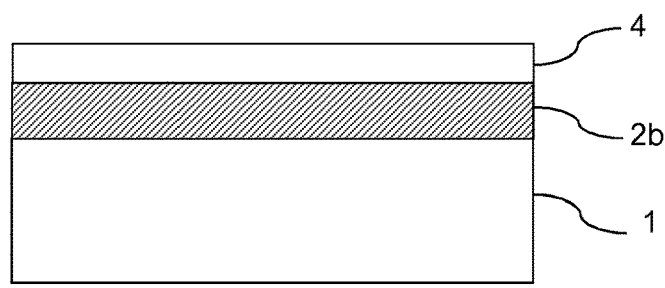

With reference to FIG. 4B, the intermediate layer 4, which is, for example, made of polysilicon and/or amorphous silicon, is deposited. This deposition may be achieved by CVD or by epitaxy at various temperatures (ranging from 300° C. to more than 800° C. depending on the techniques used). This deposition may be followed by a smoothing treatment, for example, a plasma treatment, or polish of the layer 4 in order to obtain a surface finish suitable for bonding then transferring the seed layer.

Figure 4C:
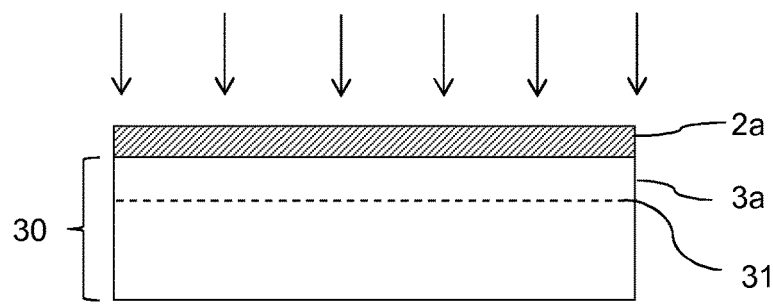

With reference to FIG. 4C, a donor substrate 30 comprising a single-crystal material suitable for the epitaxial growth of the active layer and intended to form the seed layer 3a is provided. According to one embodiment, the seed layer 3a is delineated by a weakened zone 31 formed by implanting atomic species, such as hydrogen and/or helium.

Figure 4D:
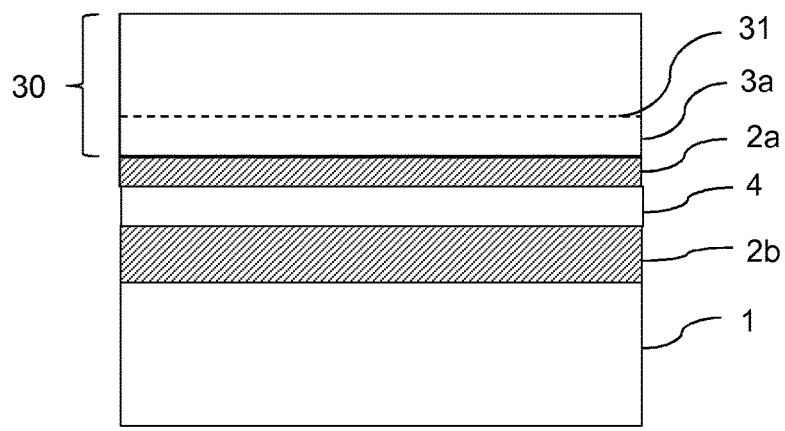

With reference to FIG. 4D, this donor substrate 30 is bonded to the intermediate layer 4 deposited beforehand on the carrier substrate 1, the first separating layer 2a being at the bonding interface. As shown in FIG. 4C, the layer 2a is, for example, formed beforehand on the surface of the donor substrate 30 before the bonding. Alternatively, the layer 2a could be formed on the intermediate layer 4 after its deposition on the carrier substrate 1, or even formed by joining a layer formed on the donor substrate and a layer formed on the deposited intermediate layer.

Next, the donor substrate 30 is thinned so as to transfer the layer 3a to the intermediate layer 4, this allowing the substrate shown in FIG. 2 to be obtained. Advantageously, the thinning involves detaching the donor substrate 30 along the weakened zone 31. Alternatively, the thinning could be carried out by polishing or etching the donor substrate from the side opposite to the bonding interface so as to obtain the thickness and surface finish desired for the epitaxy of the active layer. Typically, the thickness of the transferred seed layer is smaller than or equal to 300 nm. Optionally, a finishing treatment is carried out on the free surface of the transferred seed layer in order to promote the implementation of the epitaxy, this treatment possibly leading to the transferred layer being thinned and/or its roughness decreased.

This second embodiment of the process is particularly advantageous in that it is less expensive since it involves a single layer-transfer step instead of two.

Whatever the process for fabricating the structure illustrated in FIG. 2, a layer 3b of silicon-germanium or of silicon is then epitaxially grown on the transferred seed layer 3a until the thickness desired for the active layer (see FIG. 5) is obtained, i.e., typically a thickness larger than or equal to 1 μm. The epitaxial layer 3b may be slightly doped.

The seed layer 3a and the epitaxial layer 3b together form the active layer 3. Since the thickness of the epitaxial layer 3b is clearly larger than the thickness of the seed layer 3a, the optical properties of the active layer are considered to be essentially those of the epitaxial layer 3b, even if the layers 3a and 3b are made of different materials.

Thus, for example, if the epitaxial layer is made of SiGe but the seed layer is not made of SiGe, for example, when it is made of silicon, the silicon layer is sufficiently thin (of a thickness smaller than or equal to 300 nm) with respect to the thickness of the SiGe layer to not notably affect the properties of the active layer in terms of absorption in the infrared.

However, it is possible to modify the nature of the seed layer, for example, by means of a thermal-mixing process. As known per se, the process comprises oxidizing a SiGe layer epitaxially grown on a silicon layer, the oxidation having the effect of consuming only the silicon (to form silicon oxide) and of making the germanium migrate toward the face opposite to the free surface of the SiGe layer. An $SiO_2$ layer is then obtained on the surface, which may then be removed by etching.

Figure 6:
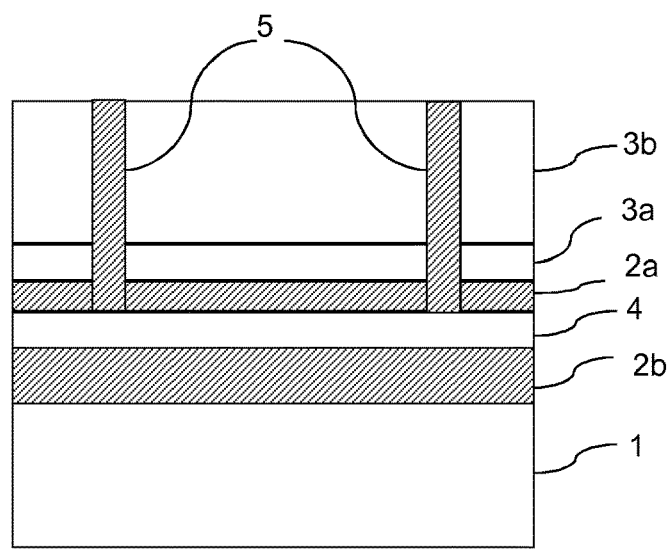
FIG. 6 illustrates the substrate obtained after forming electrically isolating trenches in the substrate of FIG. 5 in order to singulate each pixel of the imager.

With reference to FIG. 6, a plurality of electrically isolating trenches 5 that extend up to the first electrically insulating layer 2a are formed in the active layer 3. These trenches are known in the field of imagers as capacitive deep trench isolations (CDTIs). Each region of the active layer bounded by such trenches is intended to form one pixel of the imager. To this end, a subsequent step of the process for fabricating the imager is to form a photodiode (not shown) in the region. Processes for fabricating trenches and photodiodes are known to those skilled in the art and will, therefore, not be described in detail in the present text.

Figure 7A:
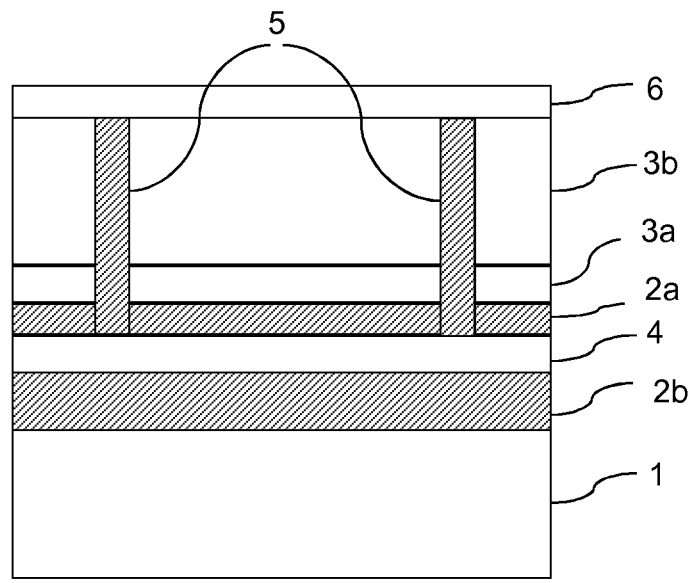
FIG. 7A illustrates the substrate obtained after forming an optical confinement layer on the substrate of FIG. 6.

According to one optional but advantageous embodiment, with reference to FIG. 7A, the active layer 3 in which the trench isolations 5 have been formed is covered with an optical confinement layer 6 having a coefficient of optical reflection from the front side toward the active layer higher than the coefficient of reflection from the active layer toward the front side. The optical confinement layer 6 consists of a stack of layers that ensure such a selectivity of the reflectivity as a function of the direction of the incident photon. According to one preferred embodiment, the optical confinement layer 6 comprises a layer of titanium nitride between two layers of silicon oxide having different thicknesses. One advantage of such a stack is that it is compatible with the processes used in microelectronics; the formation of the optical confinement layer may, therefore, be easily integrated into the process for manufacturing the imager. For example, the optical confinement layer 6 comprises, from the front side to the back side, a layer of $SiO_2$ of 100 nm thickness, a layer of TiN of 10 nm thickness and a layer of $SiO_2$ of 200 nm thickness. The reflectivity of such a stack from the front side of the imager to the active layer is 0.5%, whereas its reflectivity from the active layer to the front side is 37%.

The optical confinement layer 6 lets the radiation incident on the surface of the imager pass substantially without reflecting it, but, in contrast, reflects photons present in the active layer and reflected by the double BOX structure, this having the effect of trapping the photons in the active layer and of increasing their path length in the active layer. The optical confinement layer thus allows the optical absorption of the active layer to be increased.

Figure 7B:
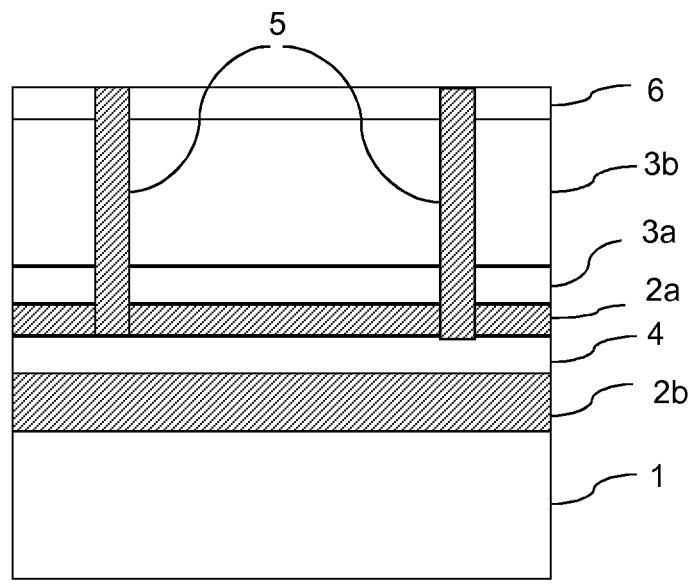
FIG. 7B illustrates the substrate obtained after forming an optical confinement layer on the substrate of FIG. 5 and forming electrically isolating trenches in the substrate.

According to one embodiment illustrated in FIG. 7B, the electrically isolating trenches 5 also extend to the optical confinement layer 6. This configuration advantageously allows two adjacent pixels (or two adjacent imagers) to be electrically isolated from each other even in the confinement layer, in particular, to avoid parasitic or shadowing effects.

Figure 8:
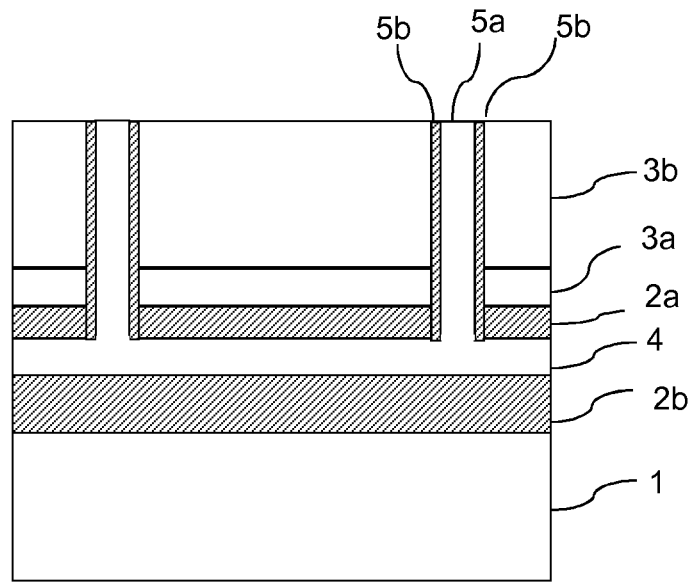
FIGS. 8 and 9 illustrate variants of the substrate of FIG. 6, in which each trench comprises a semiconductor via making contact with the intermediate layer.

According to one embodiment illustrated in FIG. 8, it is possible to bias each pixel entirely (i.e., to bias all the thickness thereof). To this end, each electrically isolating trench 5 is formed of an electrically conductive or semiconductor via 5a, for example, made of silicon, extending up to the intermediate layer 4 between walls 5b made of an electrically insulating material. This arrangement is particularly advantageous in that it allows, with a single contact, the whole of the pixel to be biased since the semiconductor layers 5a and 4 are electrically connected.

Figure 9:
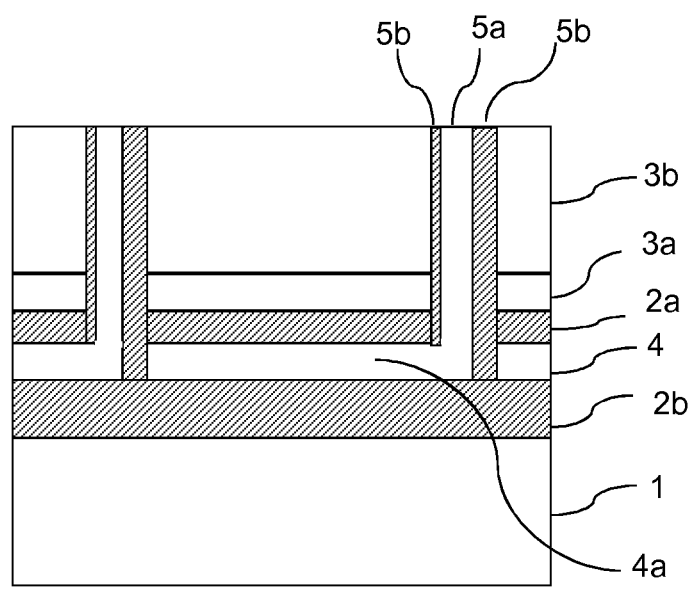

Lastly, according to one embodiment illustrated in FIG. 9, it is possible to bias each pixel entirely and independently. Specifically, by adjusting the depth and the thicknesses of the interior and exterior walls 5b of each trench, each pixel may be biased independently of the adjacent pixel. For example, each pixel may be bounded on one side (right-hand side for the central pixel of FIG. 9) by a wall 5b made of a relatively thin electrically insulating material that extends up to the intermediate layer 4, and on the other side (left-hand side for the central pixel of FIG. 9) by a wall 5b made of relatively thick electrically insulating material that extends at least partially into the second separating layer 2b. The segment 4a of the intermediate layer 4 located under the pixel is electrically connected to the semiconductor layer 5a located on only one side of the pixel (right-hand side for the central pixel of FIG. 9) and is electrically isolated from the rest of the intermediate layer 4. Thus, each pixel may advantageously be addressed independently.

Although not shown in FIGS. 8 and 9, the optical confinement layer could be present on the active layer and be passed through or not by the trenches 5 as shown in FIGS. 7B and 7A.

Examples

Figure 5:
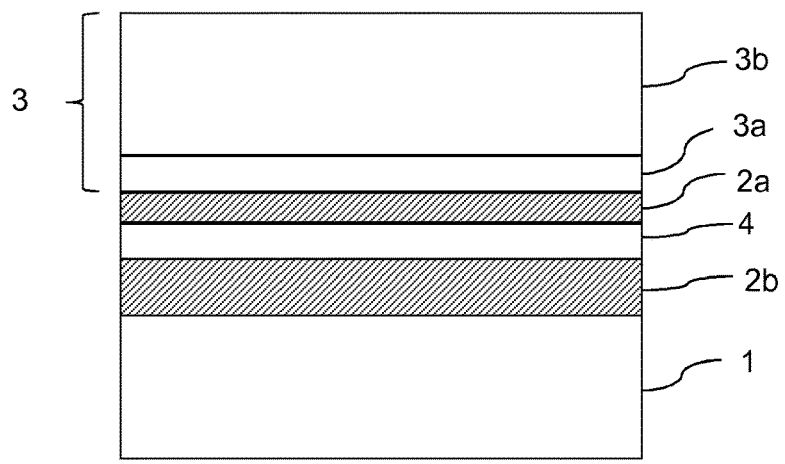
FIG. 5 illustrates the substrate obtained after epitaxial growth of the active layer on the substrate of FIG. 2.

Numerical simulations of optical absorption have been carried out for various substrates, according to the prior art (with a single layer of silicon oxide between the carrier substrate and the active layer, as illustrated in FIG. 1) and according to the disclosure (with a double BOX structure between the carrier substrate and the active layer, as illustrated in FIG. 5). The double BOX structure consists of the following stack, from the front side to the back side of the substrate:

first separating layer 2a: $SiO_2$, 40 nm
semiconductor intermediate layer 4: polysilicon, 100 nm
second separating layer 2b: $SiO_2$, 150 nm The reflectivity of such a stack is about 72% for an incident wavelength of 940 nm.

In these simulations, certain substrates were covered with an optical confinement layer having a reflectivity from the front side toward the active layer higher than the reflectivity from the active layer toward the front side. The optical confinement layer consisted of the following stack, from the front side toward the back side of the substrate: $SiO_2$, 100 nm/TiN, 10 nm/$SiO_2$, 200 nm.

The active layer consisted either of a silicon layer of 6 μm thickness, or of a SiGe layer of 2 μm thickness having a concentration of germanium equal to 10%.

The table below indicates the optical absorption coefficient in the active layer, for radiation of normal incidence (i.e., incidence perpendicular to the front side of the substrate) and having a wavelength of 940 nm. The simulation does not take into account the influence of diffraction or of refraction from the trenches separating the various pixels.

| Optical confinement layer | No | No | No | Yes | Yes | Yes |
|---|---|---|---|---|---|---|
| Carrier substrate-active layer interface | $SiO_2$ 30 nm | Double BOX | Double BOX | $SiO_2$ 30 nm | Double BOX | Double BOX |
| Active layer | Si 6 μm | Si 6 μm | $Si_{0.9}Ge_{0.1}$ 2 μm | Si 6 μm | Si 6 μm | $Si_{0.9}Ge_{0.1}$ 2 μm |
| Optical absorption coefficient | 33% | 47% | 49% | 47% | 68% | 87% |

A significant improvement in absorption is observed when a double BOX structure is used instead of a single layer of $SiO_2$. The optical absorption is further improved when the active layer is made of SiGe instead of silicon, and/or when an optical confinement layer that confines the photons in the active layer is added.

REFERENCES

US 2016/0118431

The invention claimed is:

1. A front-side imager comprising, in succession:
a semiconductor carrier substrate;
a first electrically insulating separating layer; and
an active layer comprising a single-crystal semiconductor layer, the active layer comprising a matrix array of photodiodes; and
wherein the front-side imager further comprises, between the semiconductor carrier substrate and the first electrically insulating separating layer:
a second electrically insulating separating layer, and
an intermediate layer comprising a second semiconductor or electrically conductive layer, arranged between the second electrically insulating separating layer and the first electrically insulating separating layer, the second electrically insulating separating layer being thicker than the first electrically insulating separating layer,
wherein each photodiode is separated from an adjacent photodiode by at least one electrically isolating trench extending to the first electrically insulating separating layer; and
wherein the at least one electrically isolating trench comprises an electrically conductive or semiconductor via extending up to the intermediate layer between walls made of an electrically insulating material.

2. The front-side imager of claim 1, wherein the first electrically insulating separating layer has a thickness between 10 and 100 nm.

3. The front-side imager of claim 1, wherein the second electrically insulating separating layer has a thickness between 100 and 300 nm.

4. The front-side imager of claim 1, wherein the intermediate layer comprises a doped polycrystalline or amorphous material.

5. The front-side imager of claim 1, wherein the intermediate layer comprises doped silicon.

6. The front-side imager of claim 1, wherein the intermediate layer comprises a metal.

7. The front-side imager of claim 1, wherein the intermediate layer has a thickness between 20 and 150 nm.

8. The front-side imager of claim 1, wherein the active layer comprises a silicon seed layer.

9. The front-side imager of claim 1, wherein the active layer comprises a silicon-germanium seed layer.

10. The front-side imager of claim 8, wherein the active layer further comprises a single-crystal silicon-germanium layer on the silicon seed layer.

11. The front-side imager of claim 10, wherein germanium content in the silicon-germanium layer is lower than or equal to 10%.

12. The front-side imager of claim 10, wherein a thickness of the silicon-germanium layer is smaller than a critical thickness defined as being a thickness beyond which the silicon-germanium layer relaxes.

13. The front-side imager of claim 8, wherein the active layer further comprises a single-crystal layer of silicon on the silicon seed layer.

14. The front-side imager of claim 1, further comprising, on the active layer, an optical confinement layer having a coefficient of optical reflection in a direction extending from the front side toward the active layer higher than a coefficient of optical reflection in a direction extending from the active layer toward the front side, and wherein the at least one electrically isolating trench extends through the optical confinement layer.

15. The front-side imager of claim 1, wherein each electrically isolating trench comprises a first wall extending up to the intermediate layer and a second wall extending at least partially into the second electrically insulating separating layer so as to electrically isolate a segment of the intermediate layer, the electrically conductive or semiconductor via being electrically connected to the segment of the intermediate layer.

16. A front-side imager comprising, in succession:
a semiconductor carrier substrate;
a first electrically insulating separating layer; and
an active layer comprising a single-crystal semiconductor layer, the active layer comprising a matrix array of photodiodes; and wherein the front-side imager further comprises, between the semiconductor carrier substrate and the first electrically insulating separating layer; and
a second electrically insulating separating layer,
an intermediate layer comprising a second semiconductor or electrically conductive layer, arranged between the second electrically insulating separating layer and the first electrically insulating separating layer, the second electrically insulating separating layer being thicker than the first electrically insulating separating layer; and
on the active layer, an optical confinement layer having a backside adjacent the active layer and an opposite front side, the optical confinement layer having a coefficient of optical reflection in a direction extending from the front side of the optical confinement layer toward the active layer higher than a coefficient of optical reflection in a direction extending from the active layer toward the front side.

17. The front-side imager of claim 16, wherein the optical confinement layer comprises a layer of titanium nitride between two layers of silicon oxide.

\* \* \* \* \*